United States Patent
Chang Chien et al.

(10) Patent No.: US 10,978,408 B2
(45) Date of Patent: Apr. 13, 2021

(54) SEMICONDUCTOR PACKAGE AND MANUFACTURING METHOD THEREOF

(71) Applicant: Powertech Technology Inc., Hsinchu County (TW)

(72) Inventors: Shang-Yu Chang Chien, Hsinchu County (TW); Hung-Hsin Hsu, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 41 days.

(21) Appl. No.: 16/001,953

(22) Filed: Jun. 7, 2018

(65) Prior Publication Data

US 2019/0378803 A1 Dec. 12, 2019

(51) Int. Cl.
*H01L 23/552* (2006.01)
*H01L 23/00* (2006.01)
*H01L 21/56* (2006.01)
*H01L 23/31* (2006.01)
*H01L 21/48* (2006.01)

(52) U.S. Cl.
CPC ........ *H01L 23/562* (2013.01); *H01L 21/4821* (2013.01); *H01L 21/56* (2013.01); *H01L 23/3107* (2013.01); *H01L 23/552* (2013.01); *H01L 24/09* (2013.01); *H01L 24/17* (2013.01); *H01L 2224/02379* (2013.01); *H01L 2924/3511* (2013.01)

(58) Field of Classification Search
CPC ............... H01L 23/562; H01L 21/4821; H01L 23/3107; H01L 21/56; H01L 24/17; H01L 24/09; H01L 24/07; H01L 23/552; H01L 2924/3511; H01L 2224/02379
See application file for complete search history.

(56) References Cited

U.S. PATENT DOCUMENTS

| 6,555,906 | B2 | 4/2003 | Towle et al. |
| 8,097,489 | B2* | 1/2012 | Pagaila ............... H01L 23/3121 438/106 |
| 9,677,858 | B1* | 6/2017 | Speyer ...................... F41H 5/04 |

(Continued)

FOREIGN PATENT DOCUMENTS

| TW | 201724387 | 7/2017 |
| TW | I606563 | 11/2017 |

OTHER PUBLICATIONS

"Office Action of Taiwan Counterpart Application," dated Jul. 8, 2019, p. 1-p. 6.

*Primary Examiner* — Laura M Menz
*Assistant Examiner* — Khatib A Rahman
(74) *Attorney, Agent, or Firm* — JCIPRNET

(57) ABSTRACT

A package structure including at least one semiconductor chip, an insulating encapsulant, a conductive frame, a supporting frame, a conductive layer and a redistribution layer is provided. The at least one semiconductor chip has an active surface and a backside surface opposite to the active surface. The insulating encapsulant is encapsulating the at least one semiconductor chip. The conductive frame is surrounding the insulating encapsulant. The supporting frame is surrounding the conductive frame. The conductive layer is disposed on the backside surface of the semiconductor chip. The redistribution layer is disposed on and electrically connected to the active surface of the semiconductor chip.

13 Claims, 13 Drawing Sheets

(56) References Cited

U.S. PATENT DOCUMENTS

| | | | |
|---|---|---|---|
| 9,824,988 B1* | 11/2017 | Lee | H01L 24/19 |
| 2008/0032498 A1* | 2/2008 | Kim | H01L 21/76877 |
| | | | 438/633 |
| 2012/0273960 A1* | 11/2012 | Park | H01L 23/49827 |
| | | | 257/774 |
| 2015/0018621 A1 | 1/2015 | Wellen et al. | |
| 2016/0071820 A1* | 3/2016 | Yu | H01L 21/6836 |
| | | | 257/737 |
| 2016/0336246 A1* | 11/2016 | Osada | C08L 79/04 |
| 2017/0062357 A1* | 3/2017 | Kamgaing | H01Q 1/2283 |
| 2017/0287825 A1* | 10/2017 | Lee | H01L 21/56 |
| 2018/0096941 A1* | 4/2018 | Kim | H01L 24/24 |
| 2018/0366426 A1* | 12/2018 | Lee | H01L 23/367 |

\* cited by examiner

SEMICONDUCTOR PACKAGE AND MANUFACTURING METHOD THEREOF

BACKGROUND

Technical Field

The invention relates to a package structure and a manufacturing method thereof, and more particularly, relates to a package structure that enhances warpage control and provides good electromagnetic interference (EMI) shielding.

Description of Related Art

In order for electronic product design to achieve being light, slim, short, and small, semiconductor packaging technology has kept progressing, in attempt to develop products that are smaller in volume, lighter in weight, higher in integration, and more competitive in market. For example, fan-out packages have become increasingly popular due to their compactness. However, with the reduction of product size, many problems such as warpage control and electromagnetic interference becomes critical. Improved reliability provided by integrated fan-out packages having better warpage control and good EMI shielding are the key factors for future packages.

SUMMARY

Accordingly, the present invention is directed to a package structure and a method of manufacturing thereof, wherein the package structure enhances warpage control and provides good electromagnetic interference (EMI) shielding.

The disclosure provides a package structure including at least one semiconductor chip, an insulating encapsulant, a conductive frame, a supporting frame, a conductive layer and a redistribution layer. The at least one semiconductor chip has an active surface and a backside surface opposite to the active surface. The insulating encapsulant is encapsulating the at least one semiconductor chip. The conductive frame is surrounding the insulating encapsulant. The supporting frame is surrounding the conductive frame. The conductive layer is disposed on the backside surface of the semiconductor chip. The redistribution layer is disposed on and electrically connected to the active surface of the semiconductor chip.

The disclosure provides a manufacturing method of a package structure. The method includes at least the following steps. A carrier is provided. A supporting frame and a conductive frame is disposed on the carrier, wherein the supporting frame has a plurality of openings, and the conductive frame is located in each of the openings to cover sidewalls of the openings. A least one semiconductor chip is bonded on the carrier and in the openings of the supporting frame, wherein the semiconductor chip has an active surface and a backside surface opposite to the active surface. An insulating encapsulant is formed to encapsulate the semiconductor chip and to fill the plurality of openings. A redistribution layer is formed on the active surface of the semiconductor chip and on the insulating encapsulant, wherein the redistribution layer is electrically connected to the semiconductor chip. The carrier is de-bonded. A conductive layer is formed on the backside surface of the semiconductor chip, and on the insulating encapsulant and the supporting frame.

Based on the above, the package structure is formed with a supporting frame, a conductive frame, and a conductive layer that surrounds five sides of a semiconductor chip. As such, a package structure having good electromagnetic interference (EMI) shielding can be achieved. Furthermore, by having the supporting frame surrounding the insulating encapsulant, the strength of the package structure may be improved, and warpage control may be enhanced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
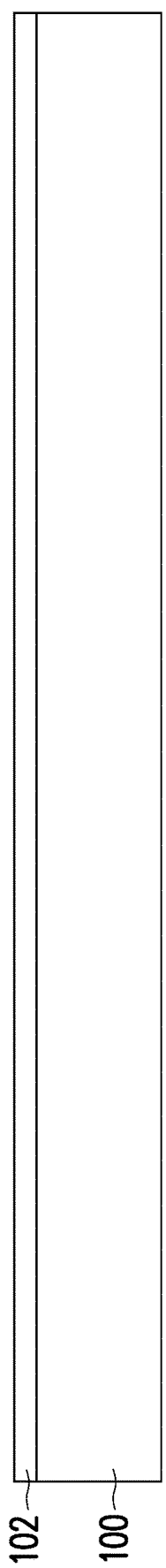
FIGS. 1, 2A, 3A and 4 to 10 are schematic cross-sectional views illustrating a manufacturing method of a package structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1, 2A, 3A and 4 to 10 are schematic cross-sectional views illustrating a manufacturing method of a package structure according to an embodiment of the invention. FIG. 2B is a top-view of the structure shown in FIG. 2A. FIG. 3B is a top-view of the structure shown in FIG. 3A.

Referring to FIG. 1, a carrier 100 is provided. In one embodiment, the carrier 100 may be made of silicon, polymer or other suitable materials. In some other embodiments, the carrier 100 may be a glass substrate or a glass supporting board. Other suitable substrate materials may be adapted as the carrier 100 as long as the material is able to withstand the subsequent processes while carrying the package structure formed thereon. As shown in FIG. 1, an adhesive layer 102 is formed on the carrier 100 to enhance the adhesion between the carrier 100 and the other structures subsequently formed thereon, and to improve the rigidity of the overall package structure during the manufacturing process. In some embodiments, the adhesive layer 102 may be a light to heat conversion (LTHC) adhesive layer, and such layer enables room temperature de-bonding from the carrier by applying laser irradiation. However, this construes no limitation in the invention, in alternative embodiments, other types of suitable adhesive layers may be used depending on requirement.

Figure 2A:
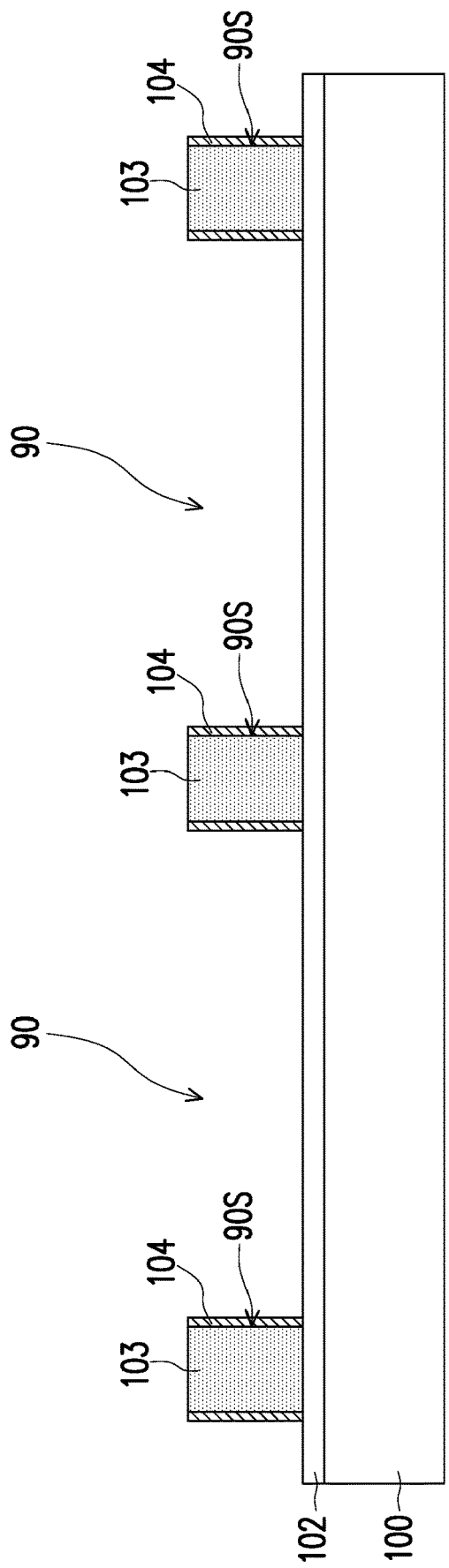
Figure 2B:
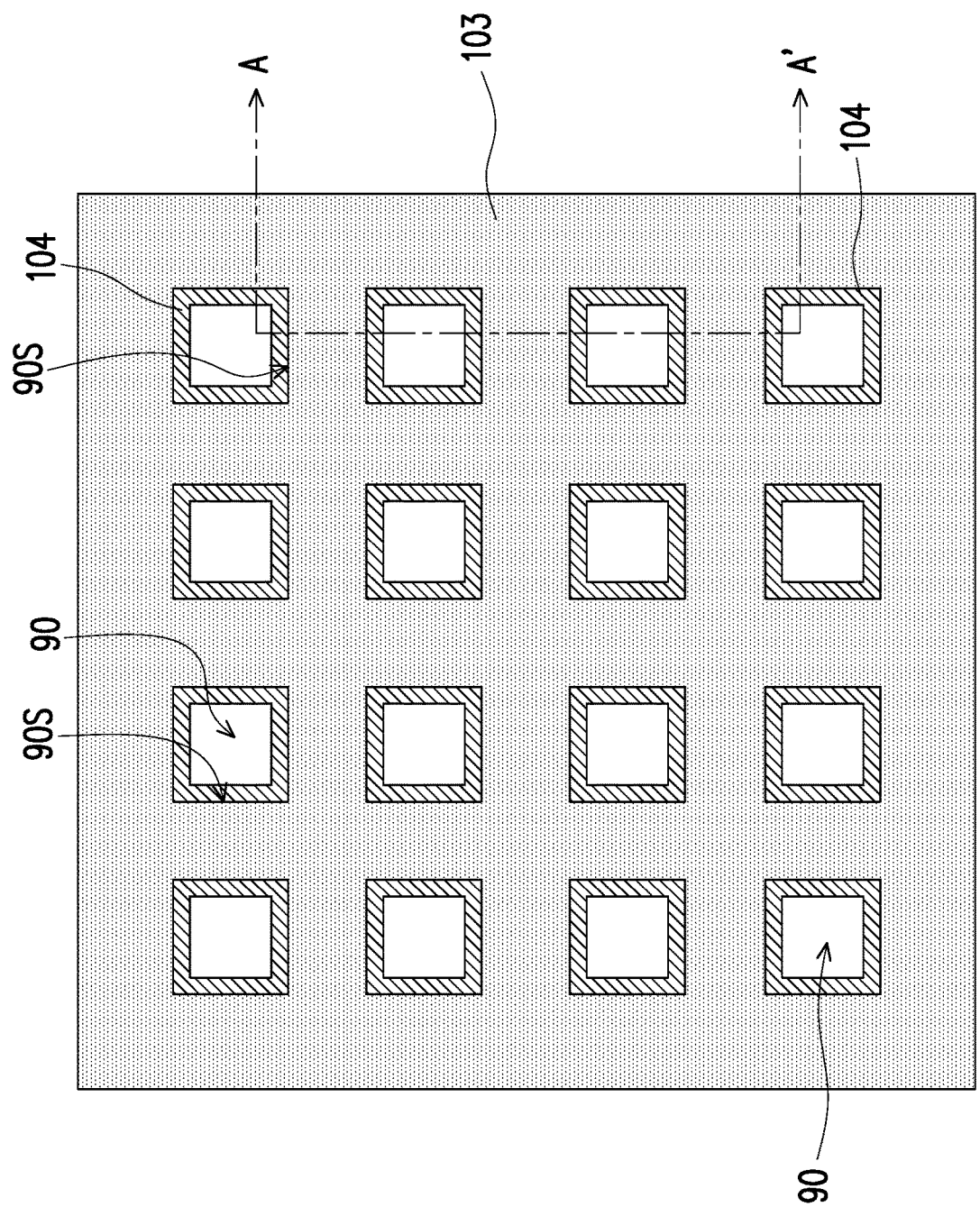
FIG. 2B is a top-view of the structure shown in FIG. 2A.

Referring to FIG. 2A and FIG. 2B, a supporting frame 103 and a conductive frame 104 are disposed on the adhesive layer 102. The supporting frame 103 and the conductive frame 104 are pre-formed before it is disposed on the adhesive layer 102. In some embodiments, a process of forming the supporting frame 103 includes providing a supporting base (not shown), then patterning the supporting base to form the supporting frame 103. The supporting frame 103 is, for example, formed with a plurality of openings 90, wherein each of the openings 90 penetrates through the supporting frame 103. In an exemplary embodiment, a material of the supporting frame 103 comprises silicon, silicon carbide, aluminum oxide, beryllium oxide, or gallium nitride. However, this construes no limitation in the invention, in some other embodiments, the supporting frame 103 may be any material having a coefficient of thermal expansion in between 2.6 ppm/° C. and 55 ppm/° C. In certain embodiments, the supporting frame 103 may be formed of a material having sufficient rigidity so that it may have enough strength to serve as a support structure, and may act to balance structure stress and enhance warpage level control.

Referring to FIG. 2A, the conductive frame 104 is located in each of the openings 90 to cover at least the sidewalls 90S of the openings 90. FIG. 2B is a top-view of the structure shown in FIG. 2A, wherein the structure shown in FIG. 2A is a sectional view taken along line A-A' of FIG. 2B. As shown in FIG. 2B, an outline of the conductive frame 104 substantially corresponds to an outline of the openings 90 of the supporting frame 103. In other words, the conductive frame 104 extends along and covers the sidewalls 90S of the opening 90. In some embodiments, a process of forming the conductive frame 104 includes placing a patterned mask (not shown) on the supporting frame 103, wherein the patterned mask reveals a portion of the openings 90. Subsequently, the conductive frame 104 is formed in the portion of the openings 90 uncovered by the patterned mask through sputtering. In certain embodiments, a material of the conductive frame 104 may include copper, tin, aluminum, steel, or other suitable conductive materials. The pre-formed supporting frame 103 and the conductive frame 104 are disposed on the adhesive layer 102 such that the openings 90 reveals a portion of the adhesive layer 102 underneath.

Referring to FIG. 2B, the openings 90 may form an array on the supporting frame 103. In the illustrated embodiment, the openings 90 form a 4×4 array on the supporting frame 103, and each of the openings 90 are separated from one another. However, this construes no limitation in the invention. It should be noted that the number of openings 90 and the arrangement of the openings 90 on the supporting frame 103 may be adjusted based on product requirement.

Figure 3A:
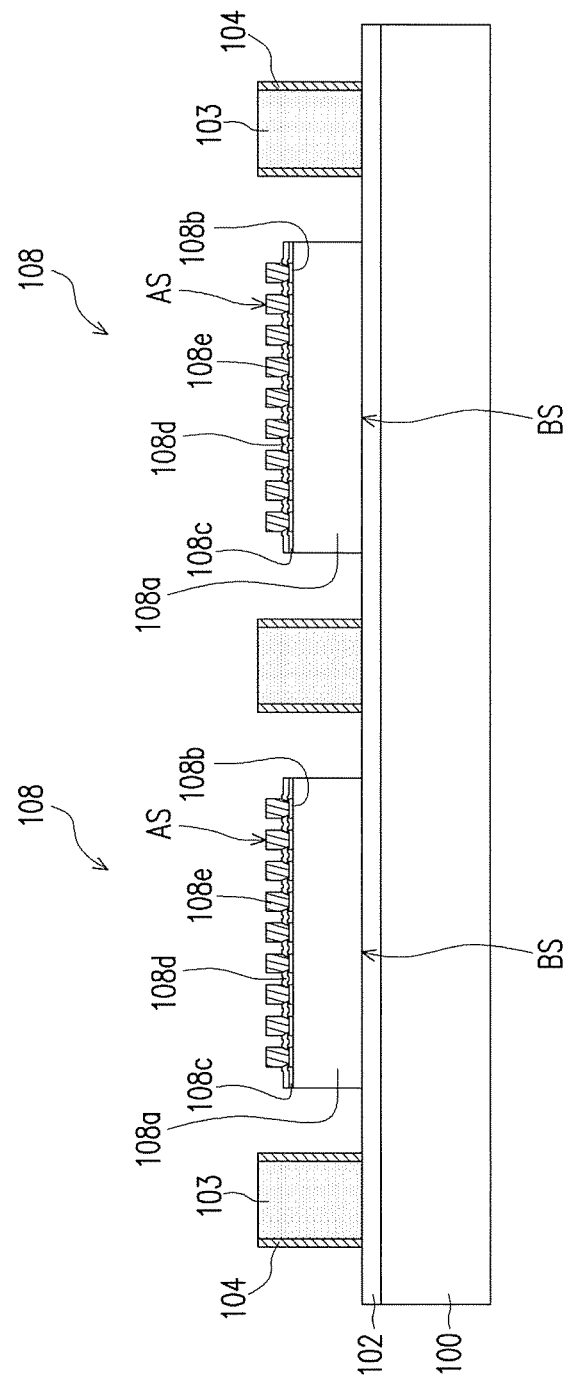
Figure 3B:
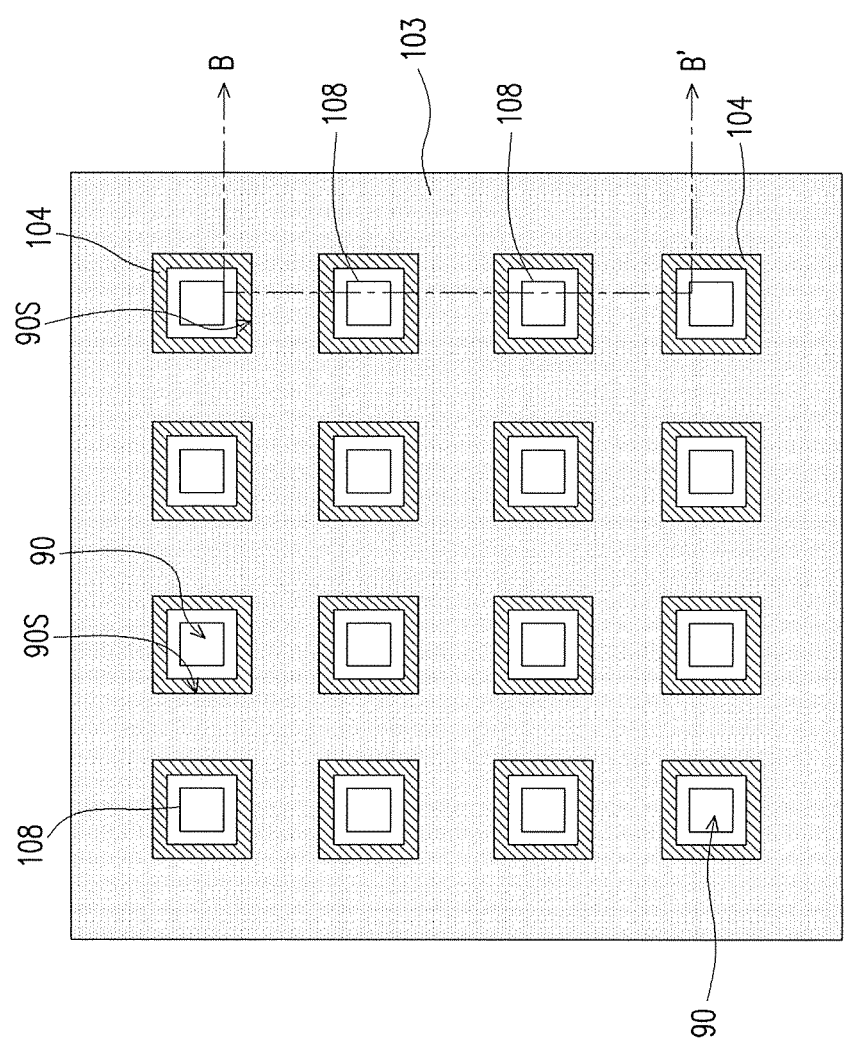
FIG. 3B is a top-view of the structure shown in FIG. 3A.

FIG. 3B is a top-view of the structure shown in FIG. 3A, wherein the structure shown in FIG. 3A is a sectional view taken along line B-B' of FIG. 3B. Referring to FIGS. 3A and 3B, after disposing the supporting frame 103 and conductive frame 104, at least one semiconductor chip 108 may be placed in each of the openings 90 of the supporting frame 103. Each of the semiconductor chip 108 may comprise a semiconductor substrate 108a, a plurality of contact pads 108b, a passivation layer 108c, a post-passivation layer 108d, and a plurality of conductive bumps 108e. The plurality of contact pads 108b is disposed on the semiconductor substrate 108a. The passivation layer 108c is disposed on the semiconductor substrate 108a and has openings that partially expose the contact pads 108b. The post-passivation layer 108d covers the passivation layer 108c and has a plurality of openings that expose at least a portion of the contact pads 108b. The plurality of conductive bumps 108e is disposed within the openings to cover the exposed portion of the contact pads 108b. In the illustrated embodiment, each of the semiconductor chip 108 are bonded on the carrier 100 (or adhesive layer 102) within the openings 90 of the supporting frame 103. Although only two semiconductor chips 108 are illustrated, it should be noted that the number of semiconductor chips is not limited thereto, and this can be adjusted based on requirement.

As illustrated in FIGS. 3A and 3B, each of the semiconductor chips 108 may have an active surface AS and a backside surface BS opposite to the active surface AS. The plurality of conductive bumps 108e is located on the active surface AS of the semiconductor chips 108, while the backside surface BS of the semiconductor chips 108 is adhered to the adhesive layer 102. In some embodiments, the semiconductor chips 108 may be adhered to the adhesive layer 102 through a die attach film (not illustrated).

Figure 4:
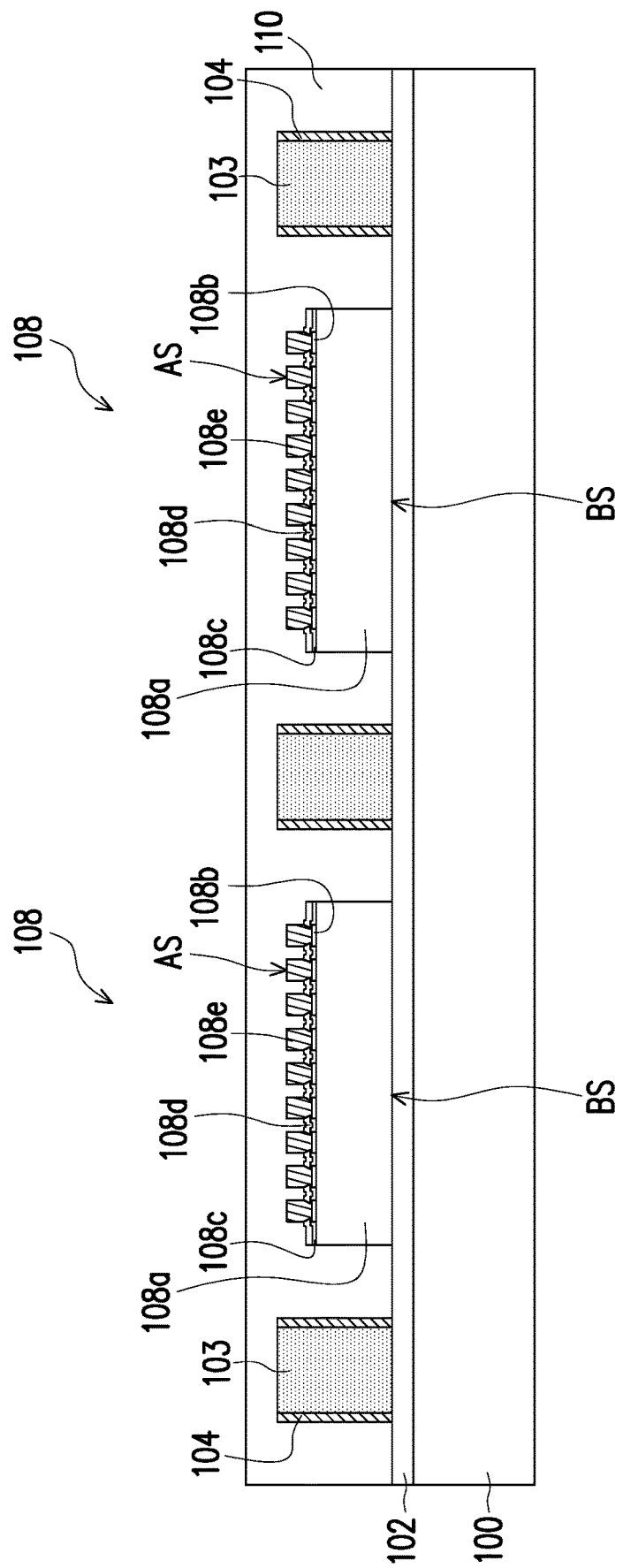

Referring to FIG. 4, after bonding the semiconductor chips 108 on the carrier 100, an insulating material 110 is formed to cover or encapsulate the semiconductor chips 108. In other words, the conductive bumps 108e of the semiconductor chips 108 are encapsulated and protected by the insulating material 110. The insulating material 110 may also encapsulate the supporting frame 103, the conductive frame 104, and fill the openings 90 of the supporting frame 103. In some embodiments, the insulating material 110 may be formed through a molding process. For example, the insulating material 110 includes an epoxy resin or other suitable polymer materials. In certain embodiments, the insulating material 110 may be a material having a coefficient of thermal expansion higher than the coefficient of thermal expansion of the supporting frame 103. In some other embodiments, the insulating material 110 may be an epoxy resin or other suitable polymer materials including fillers distributed therein. A material of the fillers includes silicon dioxide, aluminum oxide, or other suitable materials. The fillers are capable of reinforcing mechanical strength of the insulating material 110 such that the insulating material 110 may well protect the semiconductor chips 108.

Figure 5:
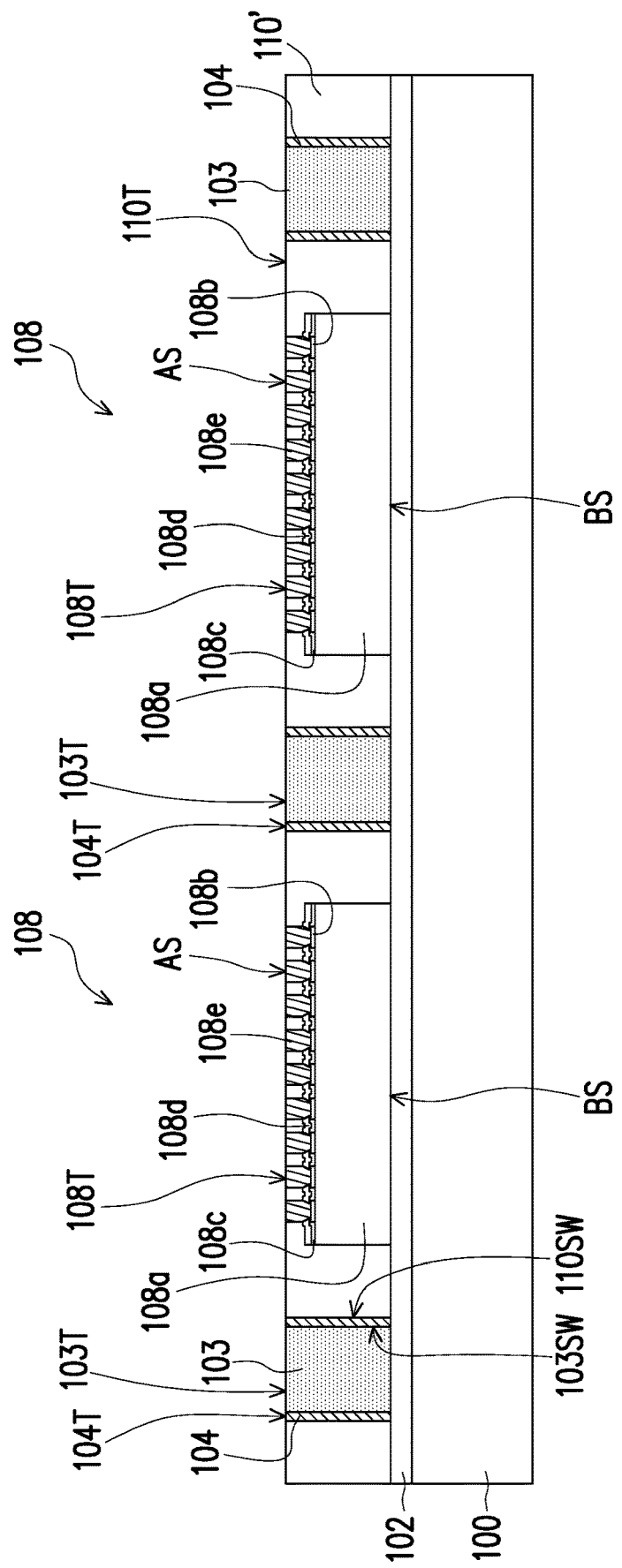

Referring to FIG. 5, the insulating material 110 is grinded until the top surfaces 103T of the supporting frame 103, the top surfaces 104T of the conductive frame 104, and the top surfaces 108T (or active surface AS) of the conductive bumps 108e are exposed. After the insulating material 110 is grinded, an insulating encapsulant 110' that encapsulate the semiconductor chips 108 is formed. The grinding process includes performing a mechanical grinding process, a chemical-mechanical grinding (CMP) process, an etching process, other suitable processes, or the combinations thereof. In some embodiments, when the grinding process is performed on the insulating material 110, a portion of the supporting frame 103 and a portion of the conductive frame 104 may also be removed. After the grinding process, a top surface 110T of the insulating encapsulant 110' is substantially coplanar with the top surfaces 103T of the supporting frame 103, the top surfaces 104T of the conductive frame 104, and the top surfaces 108T (or active surface AS) of the conductive bumps 108e. Furthermore, the conductive frame 104 is sandwiched in between the supporting frame 103 and the insulating encapsulant 110'.

Figure 6:
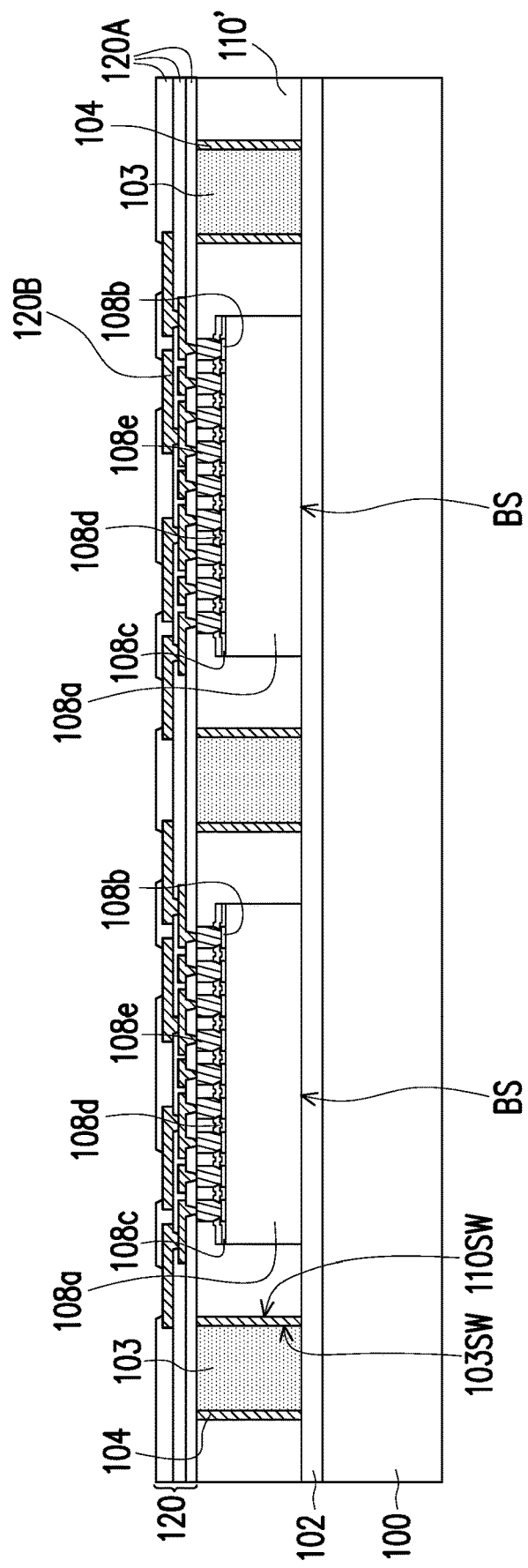

Referring to FIG. 6, a redistribution layer 120 is formed on the active surface AS of the semiconductor chips 108 and on the insulating encapsulant 110'. In some embodiments, the redistribution layer 120 includes a plurality of dielectric layers 120A and a plurality of conductive layers 120B alternately stacked. The redistribution layer 120 is electrically connected to each of the semiconductor chips 108. The conductive layers 120B are electrically connected to the conductive bumps 108e of the semiconductor chips 108. The conductive layers 120B may be formed by a plating process and may include copper, aluminum, gold, silver, tin, or a combination thereof. In the illustrated embodiment, three dielectric layers 120A and two conductive layers 120B are shown, however, this construe no limitation in the invention. In alternative embodiments, the number of dielectric layers 120A and conductive layers 120B may be adjusted based on product design. In some embodiments, the topmost dielectric layer 120A of the redistribution layer 120 may include a plurality of conductive pads (not shown). The conductive pads are for example, under-ball metallurgy (UBM) patterns used for ball mount. In some other embodiments, the conductive pads (UBM patterns) are omitted.

Figure 7:
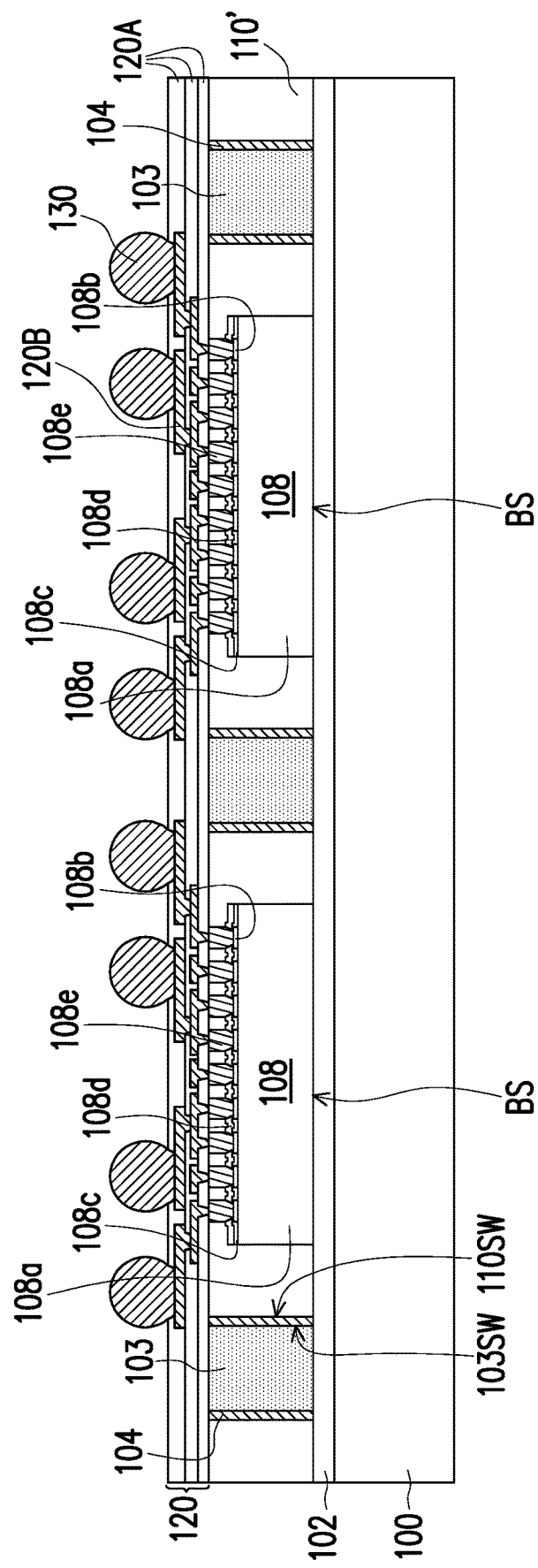

Referring to FIG. 7, after forming the redistribution layer 120, a plurality of conductive balls 130 may optionally be disposed on the redistribution layer 120. The conductive balls 130 are electrically connected to the semiconductor chips 108 through the redistribution layer 120. In some embodiments, the conductive balls 130 include tin balls or solder balls, for example, however, this construe not limitation in the invention. In certain embodiments, the conductive balls 130 may be formed by performing a ball mounting and a reflow process.

Figure 8:
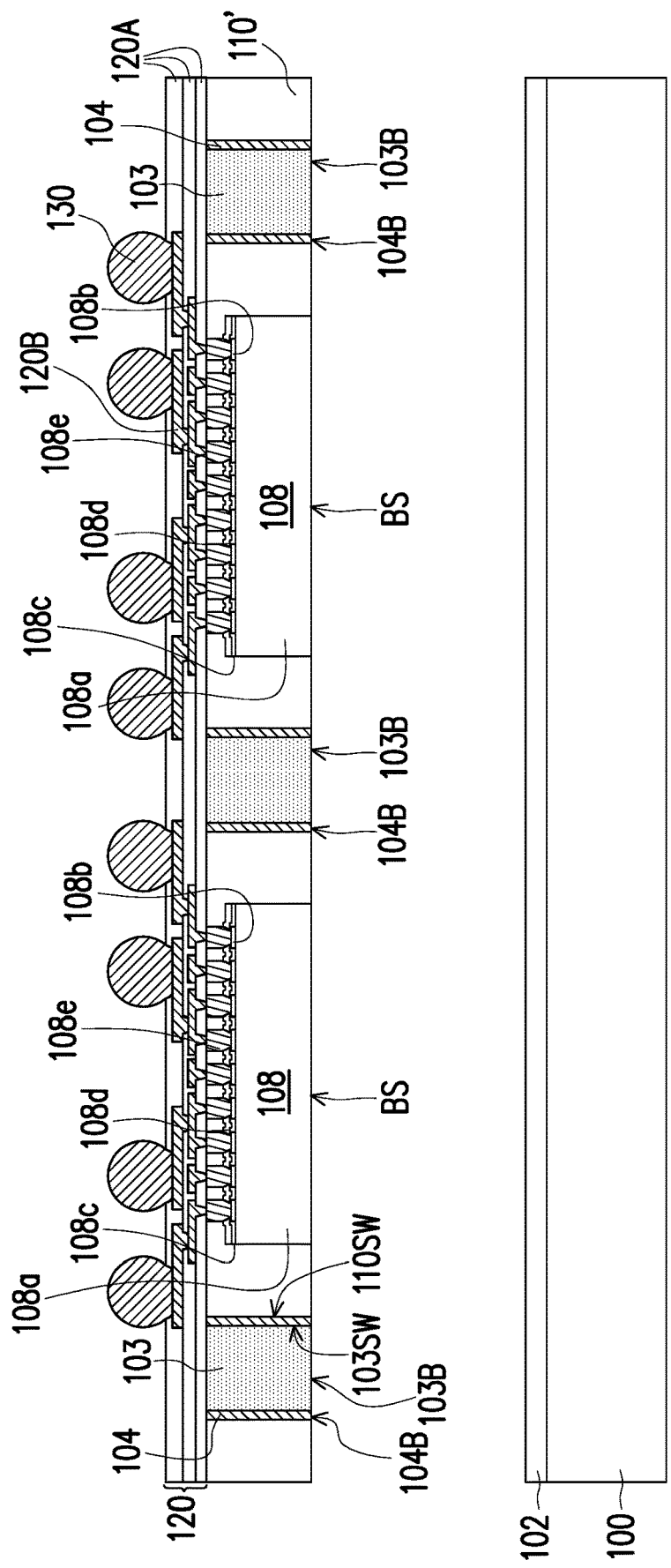

Referring to FIG. 8, after disposing the conductive balls 130 on the redistribution layer 120, the carrier 100 and the adhesive layer 102 are de-bonded or separated from the insulating encapsulant 110', the semiconductor chips 108, the supporting frame 103, and the conductive frame 104. In some embodiments, the adhesive layer 102 (e.g. LTHC release layer) is irradiated by UV laser such that other components formed thereon can be de-bonded from the adhesive layer 102 and the carrier 100. After the de-bonding process, the backside surface BS of the semiconductor chips 108, the backside surfaces 103B of the supporting frame 103, and the backside surfaces 104B of the conductive frame 104 are revealed.

Figure 9:
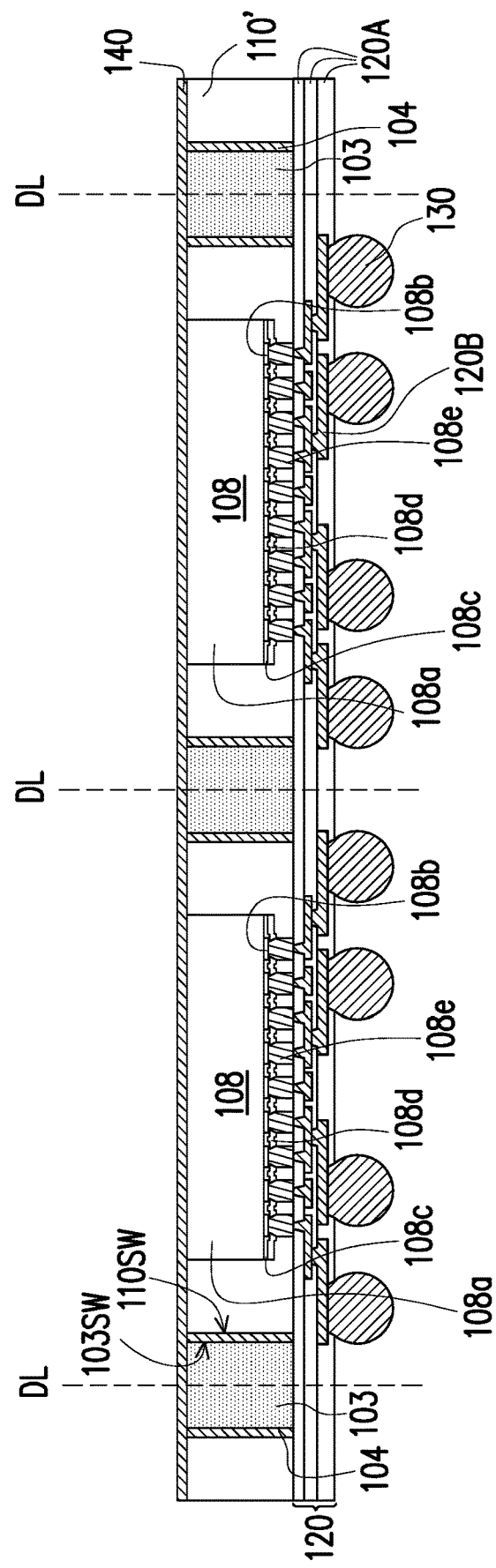

Subsequently, referring to FIG. 9, a conductive layer 140 is formed on the backside surface BS of the semiconductor chips 108, and on the insulating encapsulant 110' and the supporting frame 103. In certain embodiments, the conductive layer 140 may cover the backside surface BS of the semiconductor chips 108, the backside surfaces 103B of the supporting frame 103, the backside surfaces 104B of the conductive frame 104 and the insulating encapsulant 110'. A process of forming the conductive layer 140 may include performing a physical vapor deposition process (e.g., sputtering) or an electroplating process. A material of the conductive layer 140 may include copper, tin, aluminum, steel, or other suitable conductive material. The material of the conductive layer 140 and the material of the conductive frame 104 may be the same or different. In the exemplary embodiment, the conductive layer 140 is electrically connected to the conductive frame 104. With such configuration, five sides of the semiconductor chips 108 are surrounded by the conductive layer 140 and the conductive frame 104. As such, the formed package structure may have good electromagnetic interference (EMI) shielding.

Figure 10:
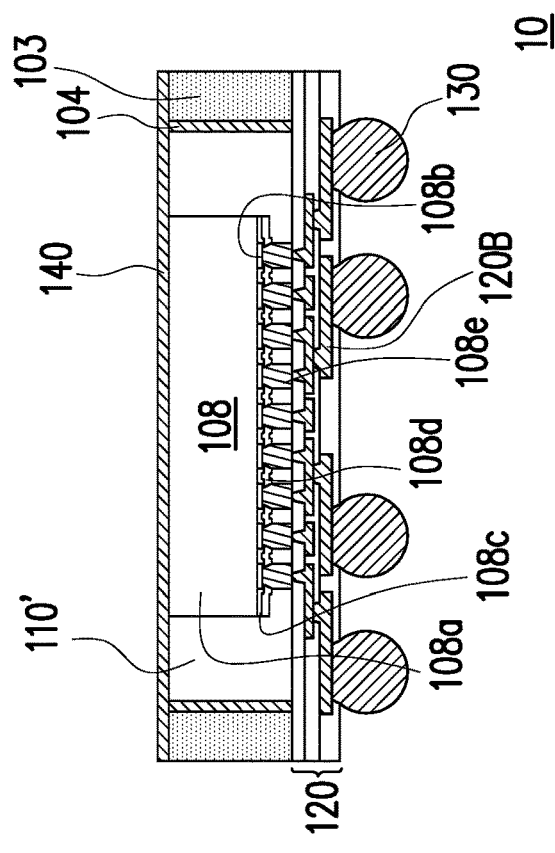
Figure 10:
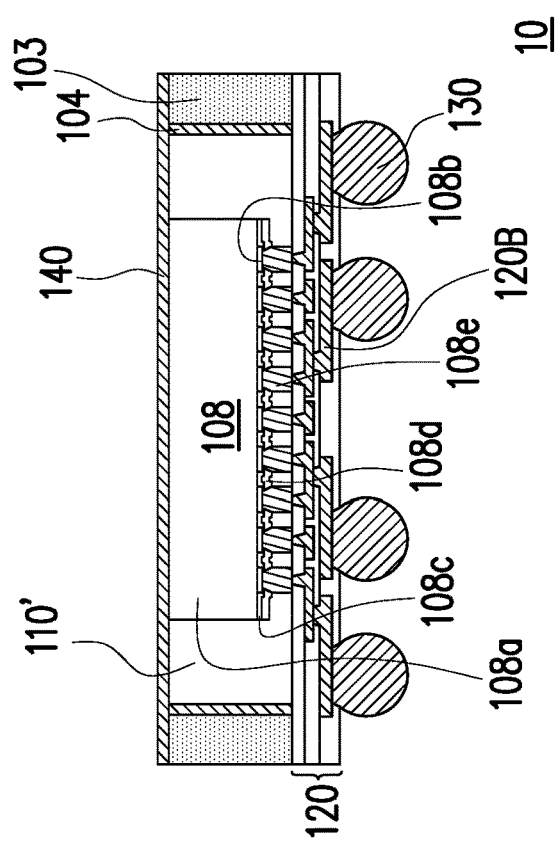

Referring to FIG. 10, after forming the conductive layer 140, a dicing process is performed along the dicing lines DL (shown in FIG. 9) to cut the whole wafer/panel structure (cutting through the conductive layer 140, the supporting frame 103 and the redistribution layer 120) into a plurality of packages 10. In the exemplary embodiment, the dicing process is a wafer dicing process or a panel dicing process including mechanical blade sawing or laser cutting. After the dicing process, the separated packages 10 may each include a supporting frame 103 and a conductive frame 104 surrounding the insulating encapsulant 110'. In other words, the insulating encapsulant 110' is not revealed from the packages 10. In the exemplary embodiment, the supporting frame 103 and the conductive frame 104 also surrounds at least one of the semiconductor chips 108. In some other embodiments, more than one semiconductor chips 108 may be included in each of the separated packages 10.

Figure 11:
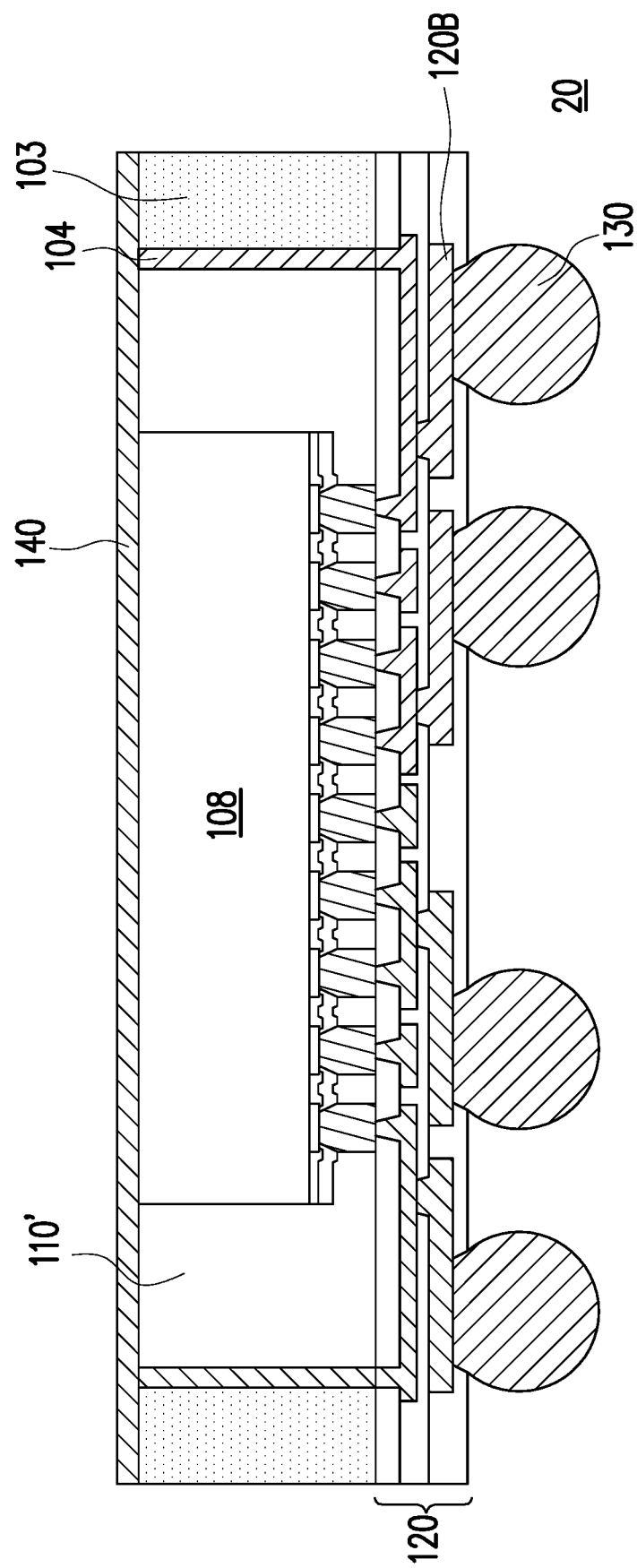
FIG. 11 is a schematic cross-sectional view illustrating a package structure according to another embodiment of the present invention.

FIG. 11 is a schematic cross-sectional view illustrating a package structure according to another embodiment of the invention. The package structure 20 shown in the embodiment of FIG. 11 is similar to the package structure 10 shown in the embodiment of FIG. 10, hence the same reference numerals are used to refer to the same or liked parts, and its description will not be repeated herein. The difference between the package 20 of FIG. 11 and the package 10 of FIG. 10 is that the conductive frame 104 of package 20 is electrically connected to the conductive layer 140 and the redistribution layer 120. As illustrated in FIG. 11, the conductive layers 120B of the redistribution layer 120 extends towards the conductive frame 104 and becomes electrically and physically connected to the conductive frame 104.

Based on the above, the package structure of the disclosure is formed with a supporting frame, a conductive frame, and a conductive layer that surrounds five sides of a semiconductor chip. As such, a package structure having good electromagnetic interference (EMI) shielding can be achieved. Furthermore, by having the supporting frame surrounding the insulating encapsulant, the strength of the package structure may be improved, and warpage control may be enhanced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A package structure, comprising:
   at least one semiconductor chip having an active surface and a backside surface opposite to the active surface;
   an insulating encapsulant encapsulating the at least one semiconductor chip;
   a conductive frame, having a conductive opening, wherein the semiconductor chip and the insulating encapsulant are disposed in the conductive opening, and the semiconductor chip and the insulating encapsulant are surrounded by the conductive frame;
   a supporting frame, having a supporting opening, wherein the conductive frame is disposed in the supporting opening, and the conductive frame is surrounded by the supporting frame;
   a conductive layer disposed on the backside surface of the semiconductor chip; and
   a redistribution layer disposed on and electrically connected to the active surface of the semiconductor chip, wherein:
   an orthographic projection of an outline of the conductive opening on a virtual plane of the backside surface is a closed contour; and
   an orthographic projection of an outline of the supporting opening on a virtual plane of the backside surface is a closed contour,
   wherein the conductive frame is electrically connected to the conductive layer and the redistribution layer,
   wherein the conductive layer covers the backside surface of the semiconductor chip, a backside surface of the supporting frame, a backside surface of the conductive frame, and the insulating encapsulant.

2. The package structure according to claim 1, wherein a coefficient of thermal expansion of the supporting frame is lower than a coefficient of thermal expansion of the insulating encapsulant.

3. The package structure according to claim 1, wherein the orthographic projection of the outline of the conductive opening on a virtual plane of the backside surface substantially corresponds to the orthographic projection of the outline of the supporting opening of the on a virtual plane of the backside surface.

4. The package structure according to claim 1, wherein the package structure comprises two or more semiconductor chips, and the semiconductor chips are separated from one another by the supporting frame and the conductive frame.

5. The package structure according to claim 1, wherein the insulating encapsulant is not revealed from the package structure.

6. The package structure according to claim 1, wherein a material of the supporting frame comprises silicon, silicon carbide, aluminum oxide, beryllium oxide, or gallium nitride.

7. The package structure according to claim 1, further comprising a plurality of conductive balls disposed on the redistribution layer, wherein the conductive balls are electrically connected to the semiconductor chip through the redistribution layer.

8. A manufacturing method of a package structure, comprising:
   providing a carrier;
   disposing a supporting frame and a conductive frame on the carrier, wherein the supporting frame has a plurality of supporting openings, the conductive frame has a conductive opening, and the conductive frame is located in each of the supporting openings to cover sidewalls of the supporting openings, wherein:
      the conductive frame is surrounded by the supporting frame;
      an orthographic projection of an outline of the conductive opening on a virtual plane of the backside surface is a closed contour; and
      an orthographic projection of an outline of the supporting opening on a virtual plane of the backside surface is a closed contour;
   bonding at least one semiconductor chip on the carrier and in the conductive opening of the conductive frame, wherein the semiconductor chip has an active surface and a backside surface opposite to the active surface;
   forming an insulating encapsulant encapsulating the semiconductor chip, and filling the conductive opening of the conductive frame, wherein the semiconductor chip and the insulating encapsulant are disposed in the conductive opening, and the semiconductor chip and insulating encapsulant are surrounded by the conductive frame;
   forming a redistribution layer on the active surface of the semiconductor chip and on the insulating encapsulant, wherein the redistribution layer is electrically connected to the semiconductor chip;
   de-bonding the carrier; and
   forming a conductive layer on the backside surface of the semiconductor chip, and on the insulating encapsulant and the supporting frame,
   wherein the conductive frame is electrically connected to the conductive layer and the redistribution layer,
   wherein the conductive layer is formed to cover the backside surface of the semiconductor chip, a backside surface of the supporting frame, a backside surface of the conductive frame, and the insulating encapsulant.

9. The method according to claim 8, wherein the supporting frame is pre-formed by the following steps before it is disposed on the carrier:
   providing a supporting base; and
   patterning the supporting base to form the supporting frame having the plurality of supporting openings, wherein each of the supporting openings penetrate through the supporting frame.

10. The method according to claim 9, wherein the conductive frame is pre-formed by the following steps before it is disposed on the carrier:
   placing a pattered mask on the supporting frame; and
   forming the conductive frame in the plurality of supporting openings of the supporting frame through sputtering by using the patterned mask.

11. The method according to claim 8, wherein two or more semiconductor chips are bonded on the carrier and in the supporting openings of the supporting frame, and the semiconductor chips are separated from each other by the supporting frame and the conductive frame.

12. The method according to claim 8, wherein a coefficient of thermal expansion of the supporting frame is lower than a coefficient of thermal expansion of the insulating encapsulant.

13. The method according to claim 8, further comprising:
   disposing a plurality of conductive balls on the redistribution layer, wherein the plurality of conductive balls is electrically connected to the semiconductor chip through the redistribution layer.

\* \* \* \* \*